United States Patent [19]

Calton

[11] Patent Number: 5,055,799

[45] Date of Patent: Oct. 8, 1991

[54] AMPLIFIER CIRCUIT WITH NON-LINEAR LOAD RESISTANCE WHICH INCREASES AMPLIFIER FORWARD GAIN AT HIGH FREQUENCY

[75] Inventor: Richard L. Calton, Ipswich, England

[73] Assignee: British Telecommunications public limited company, London, England

[21] Appl. No.: 398,286

[22] Filed: Aug. 23, 1989

Related U.S. Application Data

[63] Continuation of Ser. No. 199,255, filed as PCT GB87/00696 on Oct. 2, 1987, published as WO88/02575 on Apr. 7, 1988, abandoned.

[30] Foreign Application Priority Data

Oct. 3, 1986 [GB] United Kingdom ............... 8623838

[51] Int. Cl.$^5$ ........................... H03F 1/26; H03F 3/04
[52] U.S. Cl. .................................. 330/297; 330/149; 330/311
[58] Field of Search .............. 330/149, 296, 297, 311

[56] References Cited

U.S. PATENT DOCUMENTS

| | | | |
|---|---|---|---|
| 3,389,344 | 6/1968 | Fichtner | 330/297 |
| 3,450,998 | 6/1969 | Greefkes et al. | 330/311 X |
| 3,460,047 | 8/1969 | Gilbert | 330/296 X |
| 3,513,334 | 5/1970 | Brunner et al. | 330/311 X |
| 3,701,033 | 10/1972 | White | 330/306 |
| 3,890,576 | 6/1975 | Kobayashi | 330/296 X |
| 4,096,517 | 6/1978 | Hinn | 330/296 X |
| 4,240,041 | 12/1980 | Hashimoto et al. | 330/296 X |
| 4,323,854 | 4/1982 | Hester | 330/296 X |

OTHER PUBLICATIONS

Moore et al., "Transimpedance Amplifier with Improved Speed, Sensitivity, and Dynamic Range", IBM Technical Disclosure Bulletin, vol. 24, No. 8, Jan. 1982, pp. 4146–4147.

Shirai et al., "Realization of an All-Pass Network with a New Simple Circuit", IEEE J. Of Solid-State Circuits, vol. SC-14, No. 4, Aug. 1979, pp. 781–782.

Sibley et al., "A Monolithic Common-Collector Front End Optical Preamplifier", IEEE J. of Lightwave Technology, vol. LT-3, No. 1, Feb. 1985, pp. 13–15.

"Design of Low-Noise Bipolar Transimpedance Preamplifiers for Optical Receivers", M. H. El-Diwany, et al., IEE Proc. vol. 128, Part G, No. 6, Dec. 1981, pp. 299–305.

"The Design of p-i-n-Bipolar Transimpedance Pre-Amplifiers for Optical Receivers", M. J. N. Sibley, et al., Journal of the Institute of Electronic and Radio Engineers, vol. 55, No. 3, pp. 104–110, Mar. 1985.

"The Performance Analysis of PIN-Bipolar Receivers", A. F. Mitchell and M. J. O'Mahony, British Telecom Technology Journal, vol. 2, No. 2, Apr. 1984.

Primary Examiner—James B. Mullins
Attorney, Agent, or Firm—Nixon & Vanderhye

[57] ABSTRACT

An amplifier comprising a bipolar transistor with a non-linear load resistance (21) that increases the forward gain of the amplifier at high frequency. Voltage and thermal stability are provided by a chain of diodes (18) providing the input bias. Supply rail ripples introduced to the circuit via the input and via an output stage transistor (11), are in antiphase and the amplitude of the component introduced via the output stage transistor (11) can be tuned (FIG. 3) by varying the load resistance on the output stage transistor.

14 Claims, 4 Drawing Sheets

AMPLIFIER CIRCUIT WITH NON-LINEAR LOAD RESISTANCE WHICH INCREASES AMPLIFIER FORWARD GAIN AT HIGH FREQUENCY

This is continuation of application Ser. No. 07/199,255, filed as PCT GB87/00696 on Oct. 2, 1987, published as WO88/02575 on Apr. 7, 1988, now abandoned.

This invention relates to amplifiers and in particular but not exclusively to receiver amplifiers for optical transmission systems.

In optical transmission systems, and especially in submarine systems where access for maintenance is often difficult and costly, it is necessary to utilise reliable life tested components. It is also a general aim to optimise bandwidths and minimise noise for a given bit rate, and in general these factors are limited by the performance of the amplifier in the receiver. The bandwidths can be extended by reducing the feedback resistor in the amplifier but this increases the noise spectral density which leads to a reduction in signal to noise ratio. It is desirable to achieve the bandwidth extension but without increasing the noise spectral density.

Also, having established a particular operation bandwidth it is desirable to maintain as closely as possible the frequency response of the amplifier despite fluctuations in supply voltage, supply rail inductance and temperature.

The present invention is directed towards overcoming the problem of extending the bandwidth for minimum increase in noise and towards maintaining the frequency response.

Accordingly the present invention provides a transimpedance amplifier comprising an input stage constituted by at least one bipolar transistor having a load impedance, the amplifier having means for increasing the cut off frequency of the amplifier, said means comprising a compensating active element having a frequency dependent impedance and connected to increase the load impedance as the current gain of the input stage decreases.

A preferred embodiment of the invention comprises a transimpedance, d.c. coupled amplifier comprising an input stage constituted by at least one bipolar transistor connected in common emitter configuration with a collector load resistor, and a transistor in series with the load resistor having a frequency response selected to increase the forward gain of the amplifier at the upper end of the bandwidth of the amplifier.

The invention is now described by way of example with reference to the accompanying drawings in which.

Figure 1:
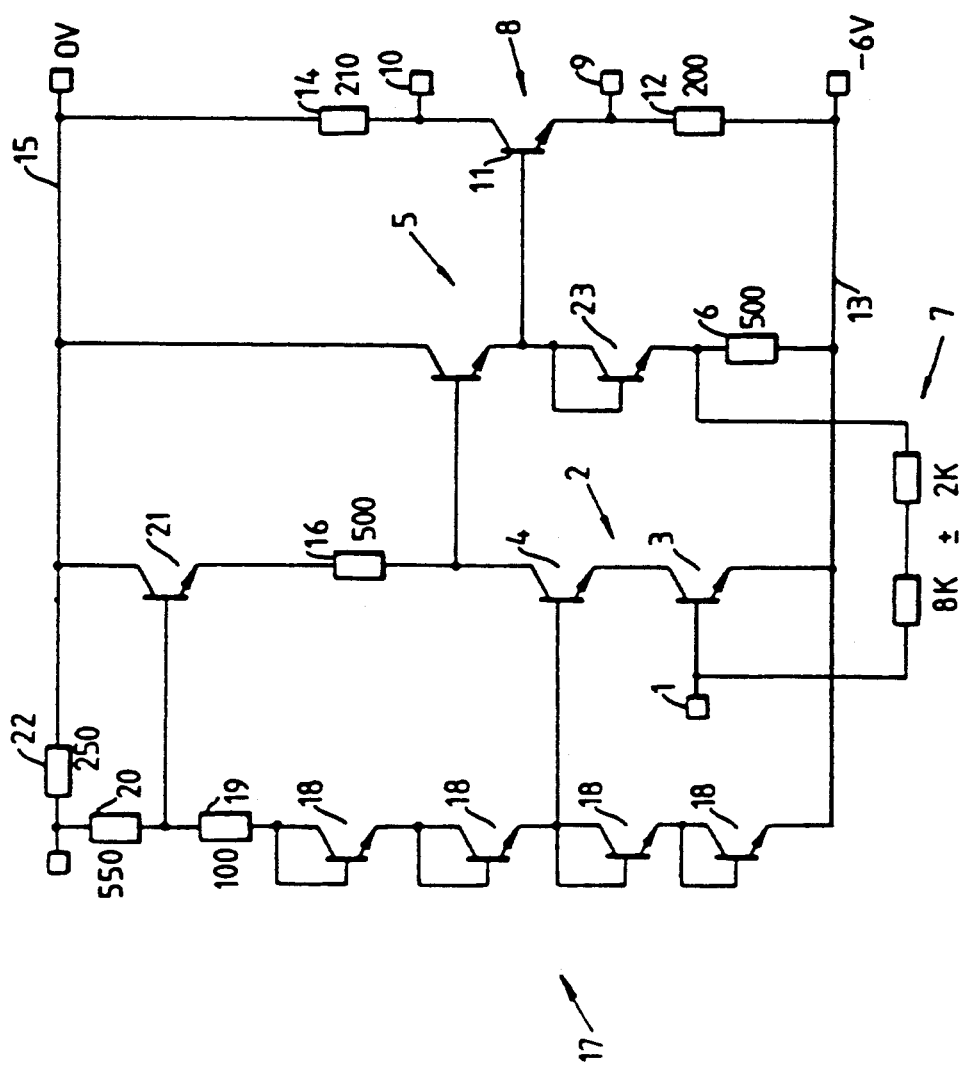
FIG. 1 is a first embodiment of a transimpedance preamplifier for an optical receiver.

FIG. 1 illustrates a transimpedance amplifier which is primarily intended for use as a preamplifier stage of an optical receiver. Normally, a photodiode, which would be optically coupled to an optical transmission line, would be connected to an input terminal 1 of the preamplifier. The numerals without lead lines refer to exemplary resistor values.

In this embodiment the amplifier comprises a cascode stage 2, constituted by bipolar transistors 3 and 4, and a common collector, or emitter follower transistor 5. The transistor 5 has an emitter load resistor 6; a resistive feedback network 7 provides shunt voltage feedback to the input terminal 1. The emitter follower stage is followed by an output buffer stage 8 having output terminals 9 and 10 connected to the emitter and collector respectively of the bipolar transistor 11, which has an emitter resistor 12 connected to a negative rail 13, at minus 6 volts, and a collector resistor 14 connected to a zero volts rail 15. Outputs may be taken from either output terminal or from both, and when outputs are taken from both output terminals they may either be used independently or in balanced mode.

A bias network 17 for the cascode stage comprises a chain of diodes, in this example four diodes constituted by transistors which are similar to those in the cascode and common emitter stages and of which each has a shorting connection between base and collector terminals. Thus each diode 18 provides an emitter base voltage comparable with those of transistors 3, 23, 5 and 21 and therefore compensates thermal drift in those transistors. In addition, the cascode stage voltage is derived from the emitter of transistor 21 via the diodes 18 making the supply less dependent on the supply rail voltage. The chain of diodes is in series with resistors 19 and 20, to the junction of which is connected the base of a transistor 21 of which the collector emitter path is in series between the zero volts rail 15 and the collector load resistor 16 of the cascode stage. An additional resistor 22 may be interposed between resistor 20 and the rail 15; otherwise resistor 20 may be directly connected to the rail 15. On a chip resistors 20 and 22 will be provided with a facility to bond out resistor 22 which gives the facility for on chip tuning of the frequency response.

Bias for the common collector stage 5 is provided by the transistors of the cascode stage. The diode connected transistor 23 in the emitter circuit of transistor 5 is a dc shifting diode to enhance the dynamic range of the circuit.

The first stage gain is given by load impedance divided by effective emitter impedance, where effective emitter impedance equals actual emitter impedance plus base impedance divided by $\beta$ (the common emitter current gain), and with increasing frequency the effective emitter impedance of transistor 3 increases which would normally cause the open loop gain to fall off with increasing frequency.

In order to compensate for the increase in effective emitter impedance of transistor 3 load is provided with a component (transistor 21) selected to have a frequency response that causes the load impedance to increase at the same time as the increase in effective emitter impedance of transistor 3. With transistor 21 providing a specific, compensating frequency dependent component of the load the total load is given by load resistance 16+ base impedance divided by $\beta$ of transistor 21 and the second part of this expression increases as $\beta$ decreases at higher frequencies. A further resistor may be placed in series with the base of transistor 21 in order to enhance the effect of the decreasing $\beta$ (this is shown with resistor 45 in FIG. 4). In this way it is possible to maintain the overall first stage gain into the range of frequencies where fall off would otherwise occur due to the increasing effective emitter impedance of the input transistor 3. The transistor 21 also compensates for phase changes in transistor 3 at higher frequencies by virtue of undergoing similar phase changes.

The values of the resistors for the circuit depends on the parameters of the transistors and other components including parasitic capacitances, and for accurate component value selection computer modelling techniques will usually be required. Fine tuning of the frequency response is provided as mentioned above by bonding out selected resistors.

Figure 2:
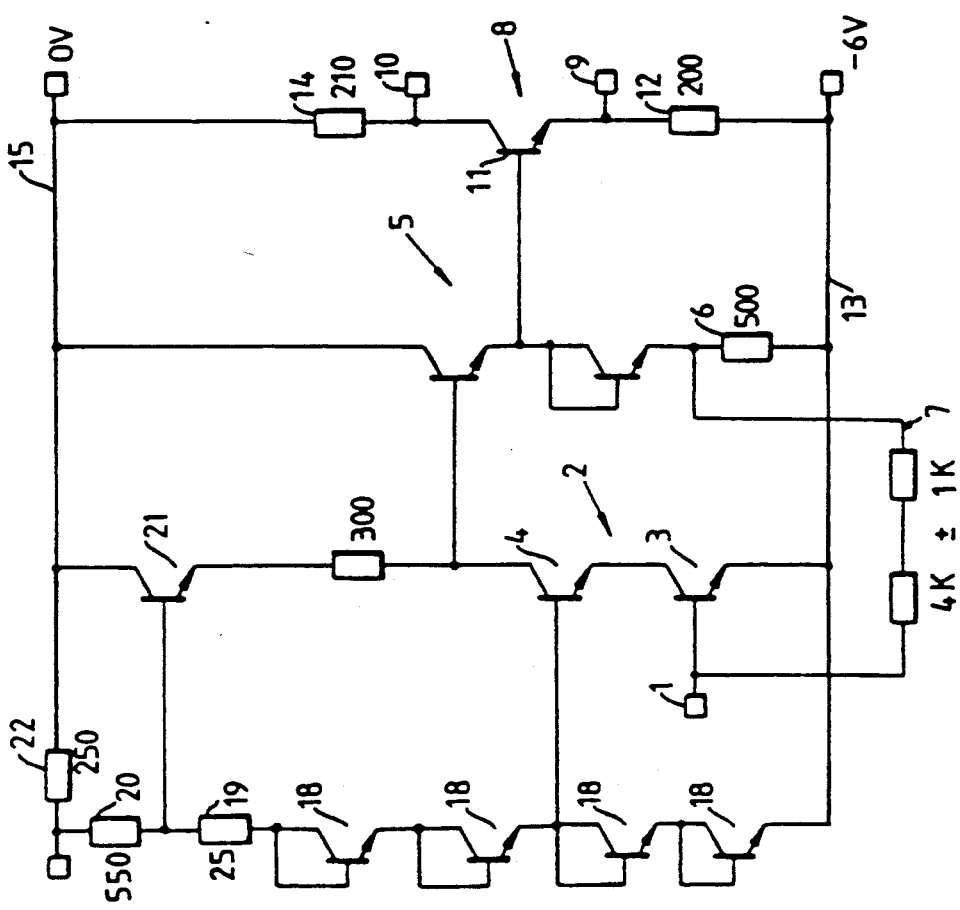
FIG. 2 illustrates a second embodiment similar to that of FIG. 1.

FIG. 2 illustrates a circuit which is generally similar to that of FIG. 1 but the impedance of the feedback loop is reduced to approximately 4k ohms, and the bias resistors 19, 20 and 22 have different values. For a given set of transistors the circuit of FIG. 2 will operate at a higher bit rate than the circuit of FIG. 1.

Figure 3:
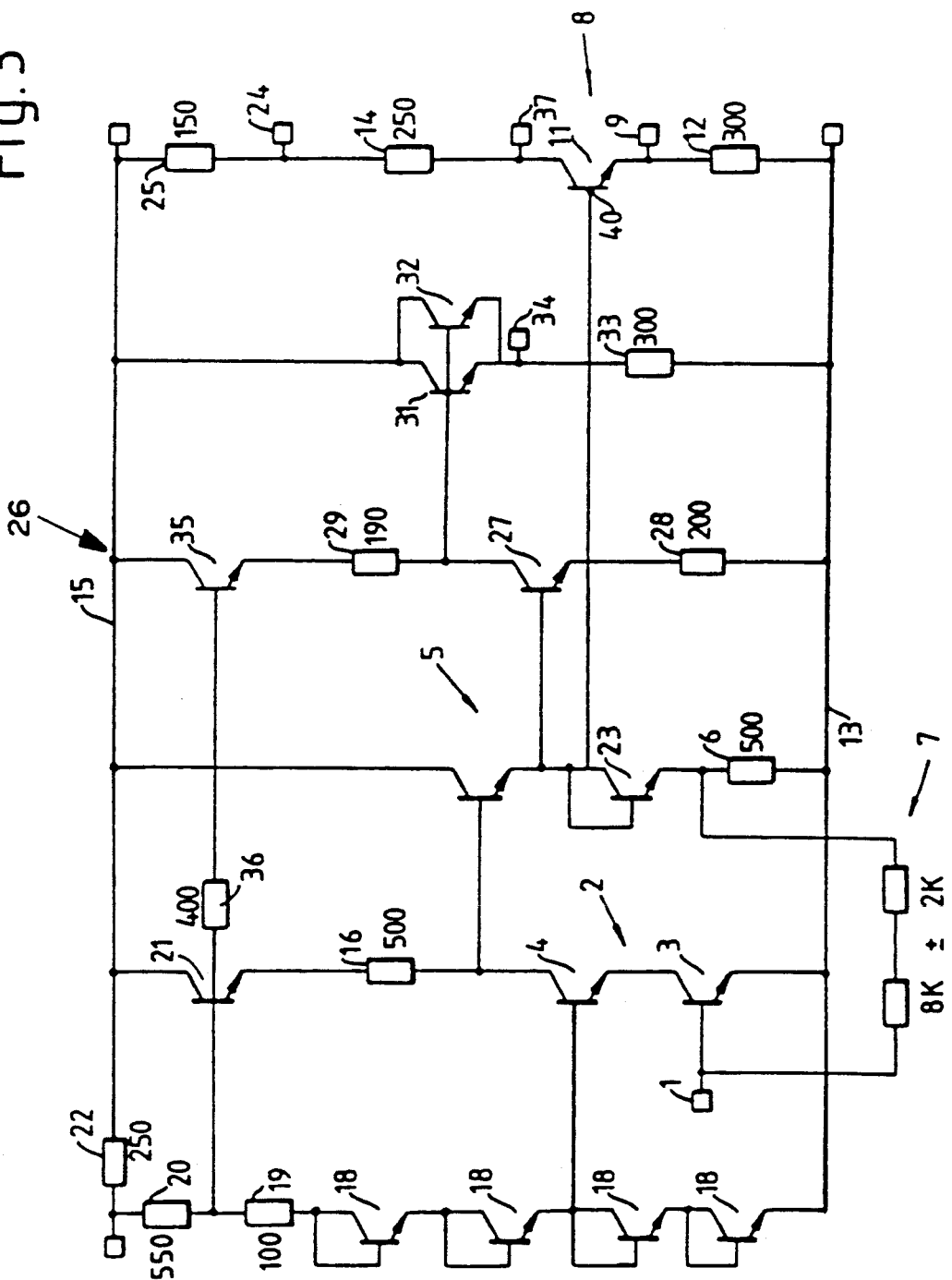
FIG. 3 illustrates a third embodiment of the invention with a further modification for improving frequency response.

FIG. 3 illustrates a circuit which has a cascode stage and an emitter follower stage similar to that shown in FIG. 1, but also includes emitter follower buffers to lower the output impedance. The output channels are 9 and 34, transistor 27 becoming essentially a phase inverter with emitter load resistor 28 and collector load resistor 29, and a common collector stage 30 comprising two parallel transistors 31 and 32 with an emitter load resistor 33. The output terminal 34 is connected between the load resistor 33 and the conjoint emitters of transistors 31 and 32. In the circuit of FIG. 3 the buffer stage 26 includes a transistor 35 in series with the collector load; the base of this transistor is biased by a resistor 36 connected to the base of transistor 21. Transistor 35 is an active load and compensates high frequency variations in transistor 27 in a way analogous to the compensation of variations in transistor 3 by transistor 21. Resistor 36 enhances this high frequency compensation by virtue of increasing the effective emitter impedance at high frequencies.

The output buffer stage 8 of FIG. 3 also has two additional capacitance compensation terminals 24 and 37. Signal dependent supply current fluctuation will induce voltage ripple on the supply rails 13 and 15 due to inductance, and this can induce ripple into the amplifier input via various stray capacitances, for example by the capacitance between rail 15 and the input pad 1. Any such ripple will be amplified along with the signal and causes distortion. The negative gain of the amplifier causes this amplified ripple at node 40 to be in antiphase to the supply rail ripple. The Miller capacitance of transistor 11 also produces ripple at node 40 from the supply rail ripple and the amplitude of this component can be adjusted by varying the load resistor of transistor 11 to cancel out the amplified antiphase ripple from the input. Fine tuning of the amplitude of the ripple can be provided by bonding out either resistor 25 or resistor 14. It will be noted that in the circuits of FIGS. 1 and 2 transistor 11 will also produce compensating ripple that will go some way towards cancelling the amplified ripple in those circuits, however the arrangements in FIGS. 1 and 2 do not permit tuning of the amplitude of the compensating ripple.

Figure 4:
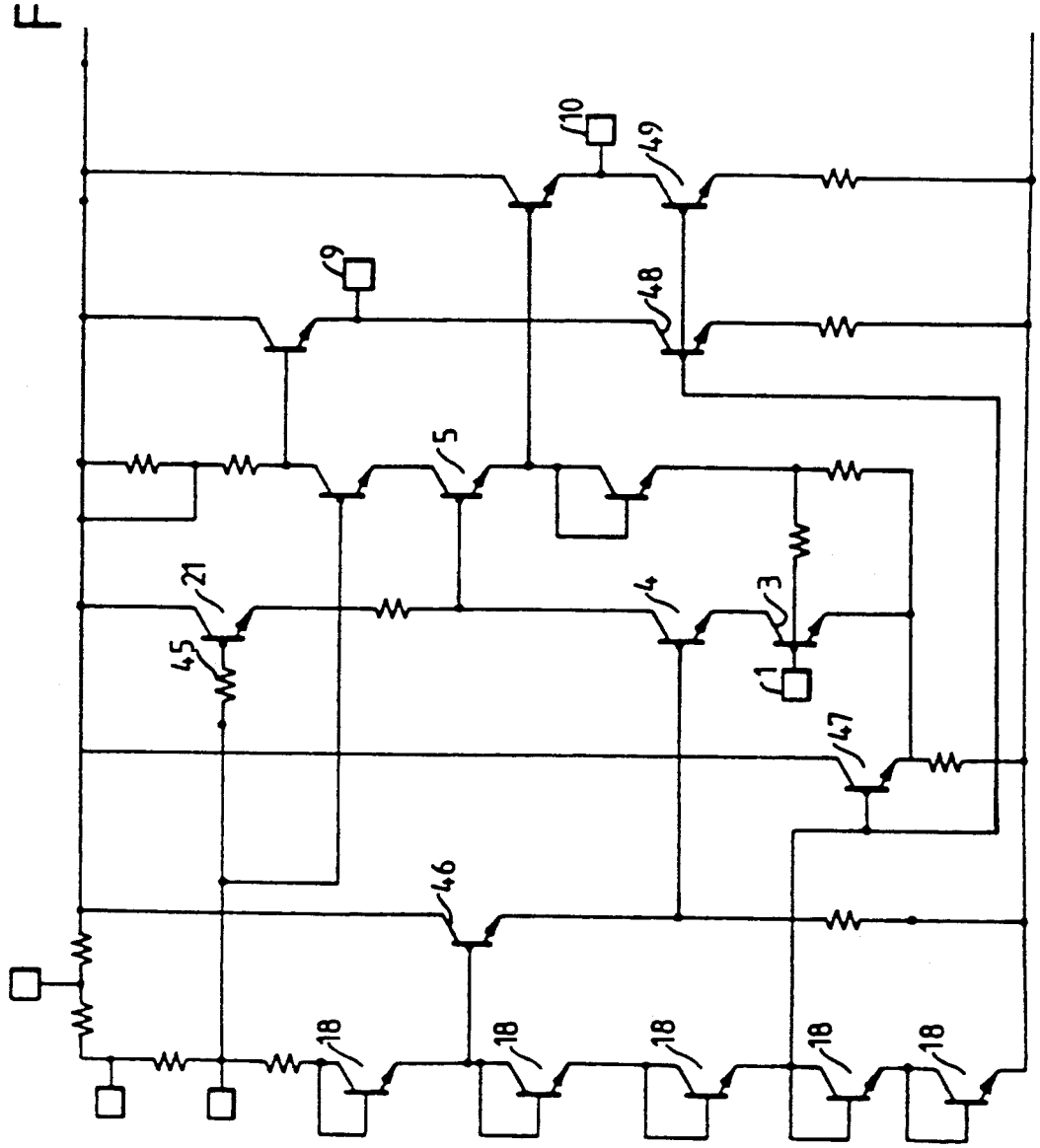
FIG. 4 shows a fourth embodiment of the invention in which induced supply rail ripple is reduced.

FIG. 4 illustrates a further embodiment of the invention in which signal induced supply rail ripple is substantially prevented by connecting transistors 46, 47, 48 and 49 as constant current sources. This circuit may be regarded as a circuit similar to that of FIG. 1 floated within a circuit that pins the supply currents.

Although the invention has been described with reference to a d.c. coupled amplifier, an analogous a.c. coupled amplifier is contemplated.

I claim:

1. A transimpedance amplifier of the type having a cutoff frequency, said amplifier comprising:

an input stage including at least one bipolar transistor having a load impedance and providing current gain; and compensating means operatively coupled to said input stage for increasing the cutoff frequency of the amplifier and for thereby compensating for decrease of input stage gain with input signal frequency, said compensating means comprising a compensating active means having a frequency dependent impedance, said compensating active means for increasing said input stage load impedance as the current gain of the input stage decreases, said compensating active means comprising means for providing a response which varies with frequency indirectly relative to the gain of said input stage with frequency.

2. An amplifier according to claim 1 in which the compensating element comprises a bipolar compensating transistor having its emitter-collector circuit in series with the load impedance.

3. An amplifier according to claim 2 in which the input stage transistor is connected in common emitter mode and the compensating transistor is connected with its emitter coupled to the collector of said input stage transitor.

4. An amplifier according to any preceding claim 1, 2, or 3 in which the input stage is followed by a common collector transistor stage.

5. An amplifier according to any preceding claim 1, 2, or 3 in which said input stage comprises two transistors in cascode.

6. An amplifier according to any preceding claim 1, 2 or 3 wherein said amplifier has an output, and said amplifier further comprises means coupled to said output for further amplifying said input signal and for substantially reducing signal induced in said output due to supply rail ripple.

7. An amplifier according to claim 6 in which the means for reducing ripple comprises output stage transistor means for introducing supply rail ripple via the Miller capacitance of the output stage transistor which opposes supply rail ripple introduced via the input.

8. An amplifier according to claim 6 in which the means for reducing ripple comprises means for pinning the supply current.

9. An amplifier according to claim 8 in which the means for pinning comprises transistors connected as constant current sources.

10. An amplifier according to any preceding claim 1, 2 or 3 further including bias network means connected to said input stage for providing bias to said input stage and for causing the algebraic sum of the voltages of forward biased pn junctions in the input stage to balance at the load impedance.

11. An amplifier according to any preceding claim 1, 2 or 3 further including an output buffer stage, coupled to said input stage, comprising a bipolar transistor having an adjustable load resistor.

12. A transimpedance amplifier for amplifying an input signal, said amplifier comprising:

an input bipolar junction transistor stage having an input terminal connected to receive said input signal and having an output terminal, said input stage having an effective emitter impedance which increases with the frequency of said input signal and thereby causes the open loop gain of said input stage to fall off with increasing input signal frequency; and active load means connected to said input stage output terminal for providing a load impedance at said input stage output terminal, said active load means including component means for compensating for said effective emitter impedance increase and for increasing said load impedance with the frequency of said input signal.

13. An amplifier as in claim 12 wherein said component means is also for compensating for phase changes introduced by said input stage at high input signal frequencies.

14. An amplifier as in claim 12 wherein;
said amplifier further includes bias network means connected to said input stage for providing bias to said input stage; and
said active load means includes:
a collector load resistor having a first end connected to said input stage output terminal and having a further end: and
further bipolar junction transistor means having an emitter connected to said load resistor further end, having a collector connected to a power suply rail, and having a base operatively connected to said bias network means, said further transistor means for providing a frequency response which causes said load impedance to increase with input signal frequency, said load impedance increase following said increase in effective emitter impedance of said input stage with input signal frequency.

* * * * *